(12) United States Patent
Gangwal et al.

(10) Patent No.: US 10,459,029 B2
(45) Date of Patent: Oct. 29, 2019

(54) ON-CHIP CLOCK CONTROL MONITORING

(71) Applicant: Seagate Technology LLC, Cupertino, CA (US)

(72) Inventors: Paras Gangwal, Maharashtra (IN); Komal Shah, Mumbai (IN); Surbhi Bansal, Pune (IN); Sachin Bastimane, Pune (IN)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 103 days.

(21) Appl. No.: 15/864,584

(22) Filed: Jan. 8, 2018

(65) Prior Publication Data

US 2019/0212387 A1    Jul. 11, 2019

(51) Int. Cl.
 *G01R 31/317*      (2006.01)
 *G01R 31/3177*    (2006.01)
(52) U.S. Cl.
 CPC ... *G01R 31/31727* (2013.01); *G01R 31/3177* (2013.01); *G01R 31/31725* (2013.01)
(58) Field of Classification Search
 CPC ........ G01R 31/31727; G01R 31/31725; G01R 31/3177
 See application file for complete search history.

(56) References Cited

U.S. PATENT DOCUMENTS

| 7,925,465 | B2 | 4/2011 | Lin et al. |
| 8,290,738 | B2 | 10/2012 | Lin et al. |
| 8,375,265 | B1 | 2/2013 | Venkatasubramanian et al. |
| 9,234,938 | B2 | 1/2016 | Khullar et al. |
| 9,264,049 | B2 * | 2/2016 | Bahl .............. G01R 31/318552 |
| 9,482,719 | B2 * | 11/2016 | Syed ................ G01R 31/31705 |
| 9,599,672 | B2 | 3/2017 | Abhishek et al. |
| 2005/0240847 | A1 | 10/2005 | Nadeau-Dostie et al. |
| 2005/0276321 | A1 | 12/2005 | Konuk |
| 2006/0117230 | A1 | 6/2006 | Scipioni et al. |
| 2007/0245180 | A1 | 10/2007 | Li |
| 2009/0003424 | A1 | 1/2009 | Waayer et al. |

(Continued)

OTHER PUBLICATIONS

Lin, Xijiang et al., "High-Frequency, At-Speed Scan Testing", Mentor Graphics, 0740-7475/03/$17.00(c)2003 IEEE, Copublished by the IEEE CS and the IEEE CASS, Sep.-Oct. 2003, 9 pages.

(Continued)

*Primary Examiner* — Phung M Chung
(74) *Attorney, Agent, or Firm* — Westman, Champlin & Koehler, P.A.

(57) ABSTRACT

An on-chip clock (OCC) circuit of an integrated circuit includes a clock generator, an OCC controller, and an OCC observation circuit. The clock generator is configured to generate a plurality of clock signals. The OCC controller is configured to receive the clock signals and generate an OCC output for use by the scan chains of logic blocks. The OCC observation circuit is configured to generate a status output on a status output port based on the OCC output during an at-speed capture phase and a scan enable signal. Patterns of the status output with respect to the scan enable signal include a valid pattern indicating that the OCC output includes a valid number of at-speed capture pulses, a first invalid pattern indicating a first error in the OCC output, and a second invalid pattern indicating a second error in the OCC output that is different from the first error.

20 Claims, 5 Drawing Sheets

(56) References Cited

U.S. PATENT DOCUMENTS

| | | |
|---|---|---|
| 2009/0187801 A1 | 7/2009 | Pandey |
| 2010/0313089 A1 | 12/2010 | Rajski et al. |
| 2012/0173943 A1 | 7/2012 | Cesari |
| 2014/0002136 A1 | 1/2014 | Greene et al. |
| 2014/0208175 A1 | 7/2014 | Kumar et al. |
| 2015/0204945 A1 | 7/2015 | Sanghani et al. |
| 2015/0323594 A1* | 11/2015 | Khullar .............. G01R 31/2815 714/727 |

OTHER PUBLICATIONS

Lin, Wei et al., "An on-Chip Clock Controller for Testing Fault in System on Chip", Proceedings of the 2nd International Conference on Computer Science and Electronics Engineering (ICCSEE 2013), Atlantis Press, Paris, France, 4 pages.

* cited by examiner

ON-CHIP CLOCK CONTROL MONITORING

SUMMARY

Embodiments of the present disclosure are directed to systems and methods for monitoring operation of an on-chip clock (OCC) controller or circuit of an integrated circuit having logic blocks coupled in scan chains. One embodiment is directed to an OCC circuit of an integrated circuit that includes a clock generator, an OCC controller, and an OCC observation circuit. The clock generator is configured to generate a plurality of clock signals. The OCC controller is configured to receive the plurality of clock signals and generate an OCC output for use by the scan chains of logic blocks. The OCC observation circuit is configured to generate a status output on a status output port based on the OCC output during an at-speed capture phase and a scan enable signal. Patterns of the status output with respect to the scan enable signal include a valid pattern indicating that the OCC output includes a valid number of at-speed capture pulses, a first invalid pattern indicating a first error in the OCC output, and a second invalid pattern indicating a second error in the OCC output that is different from the first error. The patterns may be used by an external tester to determine whether the OCC controller is operating properly.

In a method of monitoring operation of an OCC clock circuit of an integrated circuit having logic blocks coupled in scan chains, a plurality of clock signals are generated using a clock generator of the OCC circuit. An OCC output is generated for use by the scan chains of logic blocks based on the clock signals using an OCC controller of the OCC circuit. A status output on a status output port of the integrated circuit is generated using an OCC observation circuit based on the OCC output during an at-speed capture phase and the scan enable signal. This generation of the status output includes generating a valid pattern of the status output with respect to the scan enable signal when the OCC output includes a valid number of at-speed capture pulses, generating a first invalid pattern of the status output with respect to the scan enable signal when the OCC output includes a first error, and generating a second invalid pattern of the status output with respect to the scan enable signal when the OCC output includes a second error that is different from the first error. A determination is then made as to whether the OCC controller is operating properly based on the generated patterns using an external tester.

Another embodiment is directed to an integrated circuit that includes a plurality of input/output ports, logic blocks connected in scan chains, and an OCC circuit of an integrated circuit. The OCC circuit includes a clock generator, an OCC controller, and an OCC observation circuit. The clock generator is configured to generate a plurality of clock signals. The OCC controller is configured to receive the plurality of clock signals and generate an OCC output for use by the scan chains of logic blocks. The OCC observation circuit is configured to generate a status output on a status output port based on the OCC output during an at-speed capture phase and a scan enable signal. Patterns of the status output with respect to the scan enable signal include a valid pattern indicating that the OCC output includes a valid number of at-speed capture pulses, a first invalid pattern indicating a first error in the OCC output, and a second invalid pattern indicating a second error in the OCC output that is different from the first error. The patterns may be used by an external tester to determine whether the OCC controller is operating properly.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Scan testing provides an efficient approach to testing the structural integrity of devices, such as flip-flops, within a complex integrated circuit, such as a system-on-chip clock (SoC). Scan testing does not test integrated circuit-level functionality. Rather, test personnel use scan testing to confirm that individual flip-flops within an integrated circuit function properly.

While scan testing is an effective tool for detecting certain defects, some potential sources of failure are more difficult to identify. For example, each scan path under test may be affected by multiple clock sources, including an on-chip clock (OCC) controller. Unfortunately, it is challenging to isolate issues related to OCC controller behavior during scan testing. Thus, it is difficult to determine whether errors detected during scan testing are caused by an OCC controller that is not operating properly.

Figure 1:
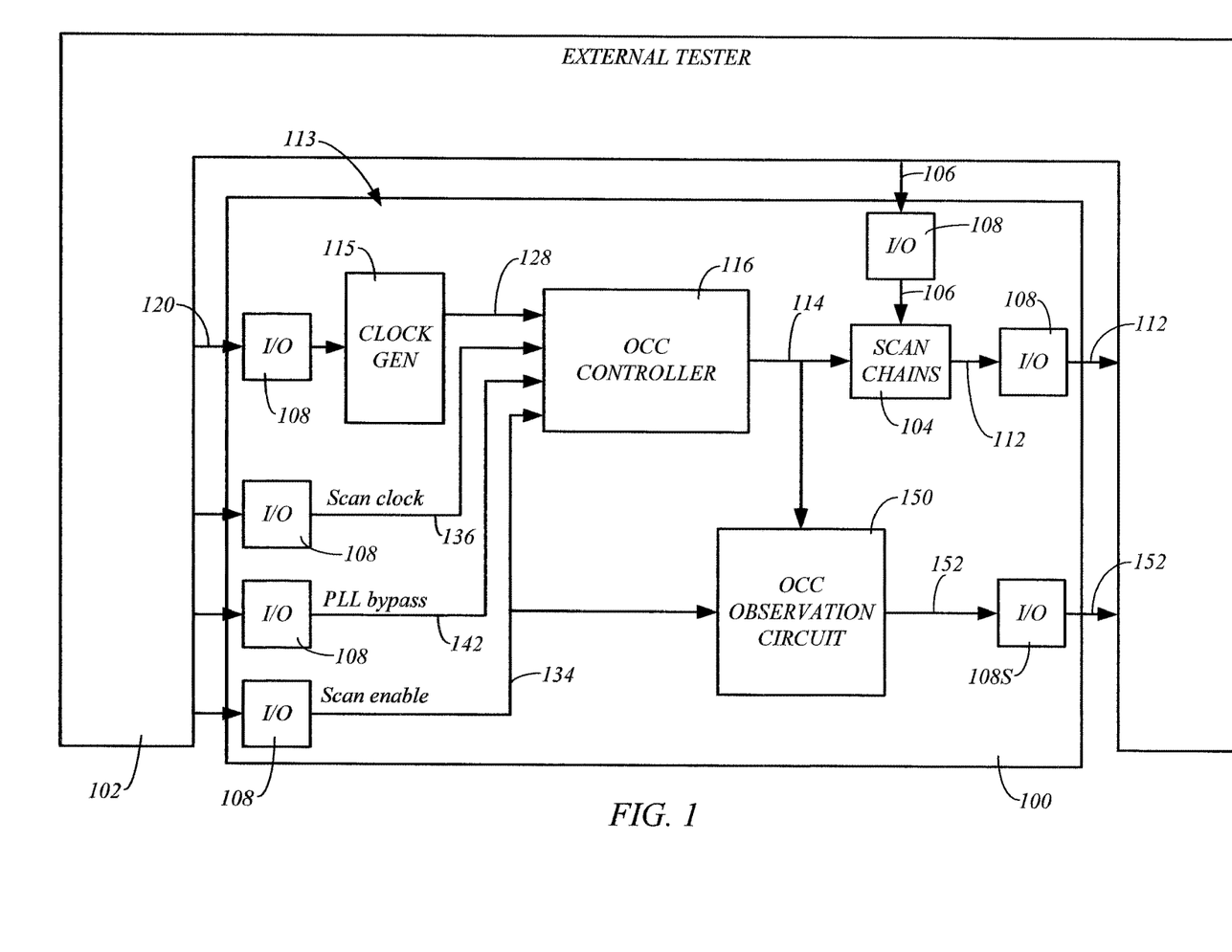
FIG. 1 is a simplified block diagram illustrating an integrated circuit (IC) coupled to an external tester in accordance with embodiments of the present disclosure.

FIG. 1 is a simplified block diagram illustrating an integrated circuit (IC) 100 (e.g., IC chip) coupled to an external tester 102, in accordance with embodiments of the present disclosure. The external tester 102 is configured to perform one or more tests on the IC 100, such as a scan test, and may include automatic test equipment, an oscilloscope, and/or other conventional integrated circuit test equipment.

The IC 100 includes scan chains 104, which include a series of interconnected functional or logic blocks, such as flip-flops, which may be tested independently during scan testing. Flip-flops and other elements within each of the scan chains 104 include, in addition to inputs and outputs used for normal operation, inputs associated with the scan testing capability. Scan testing of the logic blocks in the scan chains 104 generally tests the integrity of the devices (e.g., flip-flops) of the scan chains 104 to detect manufacturing faults.

During a scan test, the tester 102 injects input stimuli 106 (e.g., automatic test patterns) to the scan chains 104 through one or more I/O pins 108 of the IC 100, and obtains scan test outputs 112 from IC 100 through one or more I/O pins 108, as indicated in FIG. 1. The external tester 102 may compare the outputs 112 to expected results to generate scan test results that are indicative of a condition of the IC 100, such as slow-to-fall type transition delay faults.

The IC 100 includes an on-chip clock (OCC) circuit 113 that is configured to provide clock pulses or signals 114 (OCC output) to the scan chains 104 during functional operation and scan testing of the scan chains 104. In some embodiments, the OCC circuit 113 includes an clock generator 115 and an OCC controller 116 (e.g. a programmable clock multiplexer), as shown in FIG. 1 and FIG. 2, which is a simplified block diagram of the exemplary OCC circuit 113, in accordance with embodiments of the present disclosure.

Figure 2:
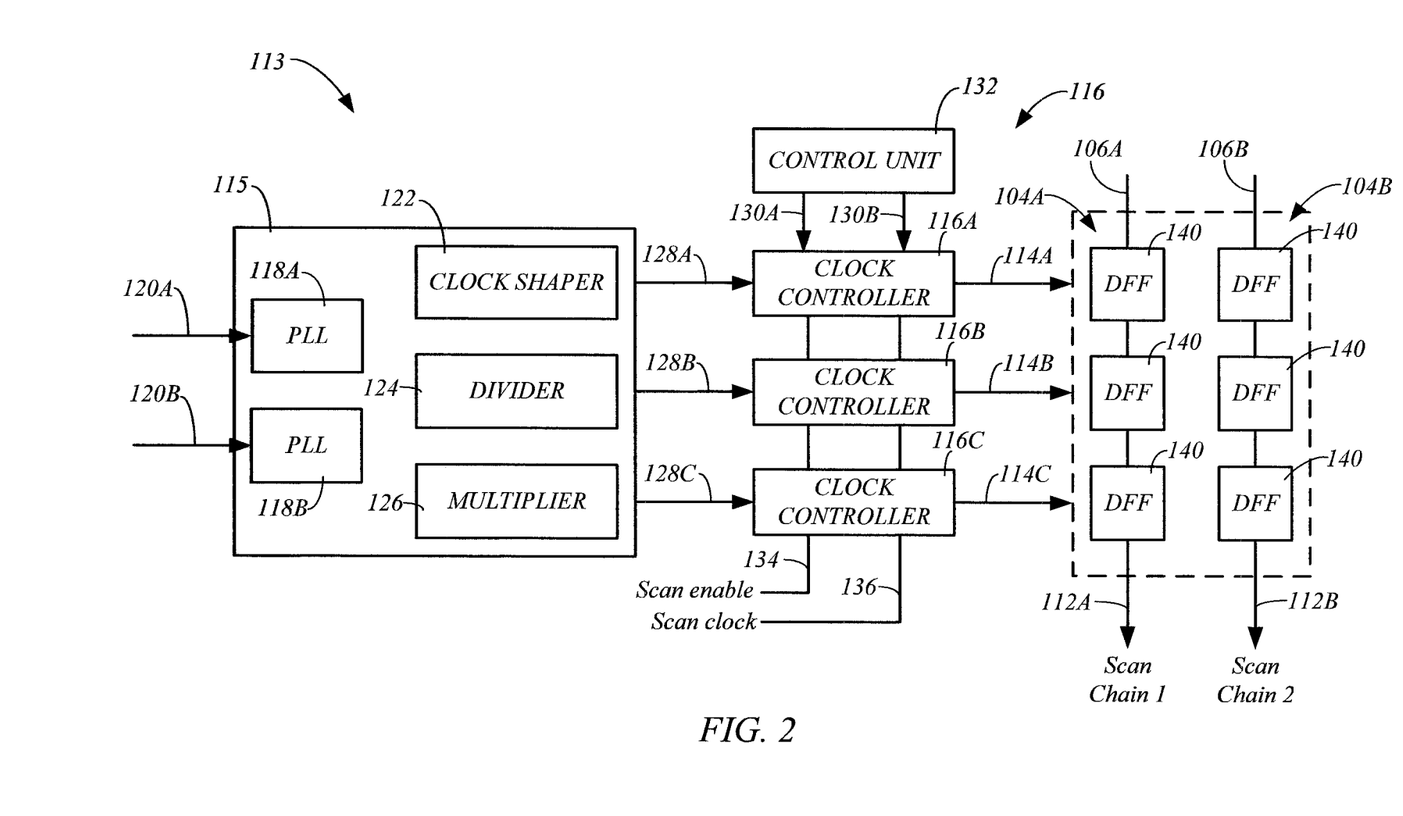
FIG. 2 is a simplified block diagram of the exemplary on-chip clock (OCC) circuit in accordance with embodiments of the present disclosure.

Embodiments of the clock generator 115 include one or more phased locked loop (PLL) units 118, such as PLL units 118A and 118B (FIG. 2). The one or more PLL units 118, each receive a reference clock, such as reference clock 120A or 120B, from the external tester 102, as shown in FIG. 2. The PLL units 118 are also associated with a clock shaper 122, a clock divider 124, and a multiplier 126 for changing the frequency, waveform shape, phase, and/or pulse duration of the reference clocks 120, for example.

In some embodiments, the clock generator 115 outputs PLL clocks 128, such as three PLL clocks 128A, 128B, and 128C to the OCC controller 116, which may comprise a separate controller, such as OCC controllers 116A, 116B, and 116C, for each of the PLL clocks 128A, 128B, and 128C, as indicated in FIG. 2. The OCC controller 116 is controlled using clock control bits 130A and 130B output from a clock chain control unit 132, a scan enable signal 134, and a scan clock signal 136 (slow clock) from the external tester 102. The OCC controller 116 outputs a plurality of shift/capture internal clock signals 114A, 114B, and 114C to drive logic blocks 140 within the scan chains 104, such as scan chains 104A and 104B shown in FIG. 2.

The OCC controller 116 switches between the slow scan clock signal 136 during shift mode, and the high frequency (fast, at-speed clock) clock signals 128A-C during an at-speed capture mode. For example, in the shift mode, which may be initiated by the scan enable signal 134 transitions from low to high, the OCC controller 116 may be bypassed based on a signal 142 (FIG. 1) from the external tester 102, and the scan clock signal 136 produced by the external tester 102 may be used to drive the logic blocks 140. The input 106, such as input stimuli 106A and 106B, may be fed to the logic blocks 140 of the scan chains 104A and 104B to detect stuck-at-faults within the logic blocks 140 based on the scan test outputs 112, such as outputs 112A and 112B, for example, as shown in FIG. 2.

In an at-speed capture mode, which may be initiated by the scan enable signal 134 transitioning from high to low, the OCC controller 116 is pulsed by the PLL clocks 128A-C or the clock divider 124. This fast, at-speed capture based scan testing may be used to detect slow-to-rise and slow-to-fall transition delay faults in the logic blocks 104 using the scan test outputs 112 (e.g., 112A and 112B) in response to launch and capture pulses from the OCC controller 116.

Detection of a transition delay fault during at-speed capture testing may generally entail a thorough diagnosis to identify the source of the failure. Potential sources of a transition delay fault failure include issues with the clock generator 115 or the OCC controller 116. The PLL units 118 and the clock divider 124 of the clock generator 115 may be tested independently, and the divided output may be observed on top level ports of the IC 100.

However, because the logic of the OCC controller 116 is chopped and available only in a short window of a scan capture phase, a determination of whether the OCC controller 116 is operating properly involves testing the logic of the OCC controller 116 directly.

The OCC controller 116 comprises flip-flops (e.g., D flip-flops) connected to form an OCC chain. The number of clock control bits 130 in the OCC chain determines the number of at-speed capture pulses that are produced by the OCC controller 116 during an at-speed capture test. Thus, for the two control bits 130A and 130B used with the exemplary OCC controller 116, the OCC controller 116 produces two at-speed capture pulses during the at-speed capture mode, when the OCC controller 116 is operating properly. Embodiments of the OCC 113 include an OCC observation circuit 150 that may be used to verify that the OCC controller 116 is operating properly during scan testing.

In some embodiments, the OCC observation circuit 150 is configured to generate a status output 152 on a status output port 108S during an at-speed capture phase based on the OCC output 114 and the scan enable signal 134. The OCC observation circuit 150 may be contained within the wrapper of the OCC circuit 113. As discussed below in greater detail, the OCC observation circuit 150 produces patterns of the status output 152 with respect to the scan enable signal 134, which may be observed using the external tester 102, as indicated in FIG. 1. These patterns include a valid pattern that indicates that the OCC output 114 includes a valid number of at-speed capture pulses (e.g., two pulses), thus indicating that the OCC controller 116 is operating properly, and two or more invalid patterns, which indicate that the OCC output 114 includes an invalid number of at-speed capture pulses (e.g., not two), thus indicating that the OCC controller 116 is not operating properly.

Figure 3:
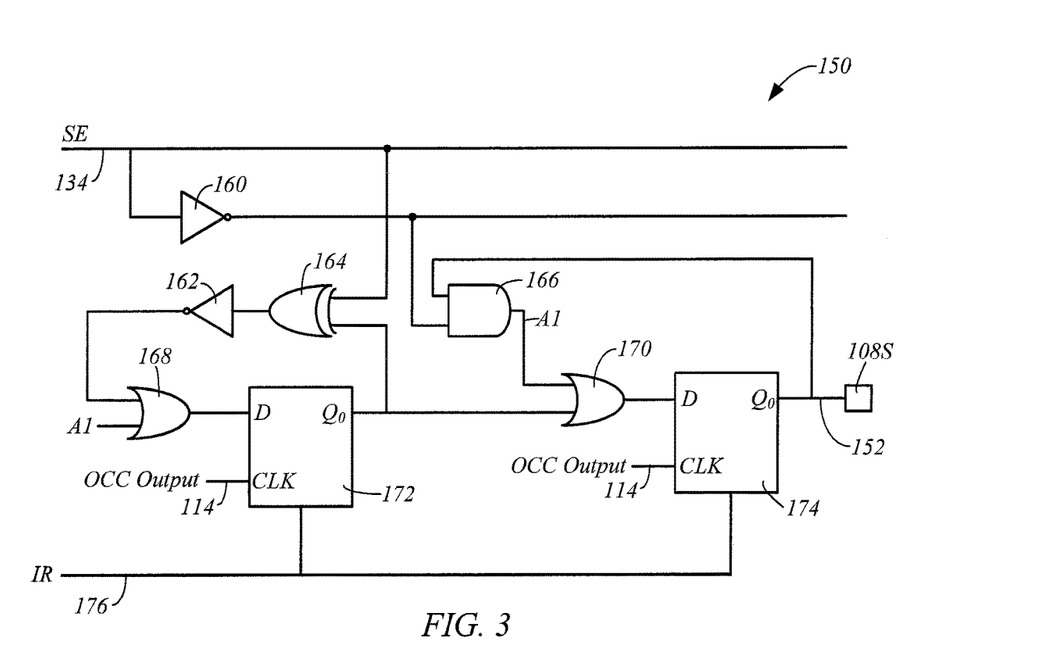
FIG. 3 is a diagrammatic illustration of an exemplary OCC observation circuit in accordance with embodiments of the present disclosure.

FIG. 3 is a diagrammatic illustration of an exemplary OCC observation circuit 150 in accordance with embodiments of the present disclosure. Logic within the OCC observation circuit 150 includes inverters 160 and 162, an XOR gate 164, an AND gate 166, OR gates 168 and 170, that are connected in the configuration shown in FIG. 3 to process the scan enable signal 134 and provide D inputs to flip-flops 172 and 174. The flip-flops 172 and 174 also receive the OCC output 114 from the OCC controller 116 as an input. In some embodiments, an initialization register (IR) 176 may also be used as an input to the flip flops 172 and 174 to clear the flip flops 172 and 174 and initialize the logic within the OCC observation circuit 150, for example.

FIGS. 4-7 illustrate signal patterns of the scan enable signal 134, the OCC output 114, and the status output 152 over time. By observing the pattern of the status output 152 at the I/O pin 108S with respect to the scan enable signal 134, the external tester 102 can determine whether the OCC output 114 is valid and the OCC controller 116 is working properly during an at-speed capture phase 180, and when the OCC output 114 contains errors during an at-speed capture phase 180 indicating that the OCC controller 116 is not working properly.

Figure 4:
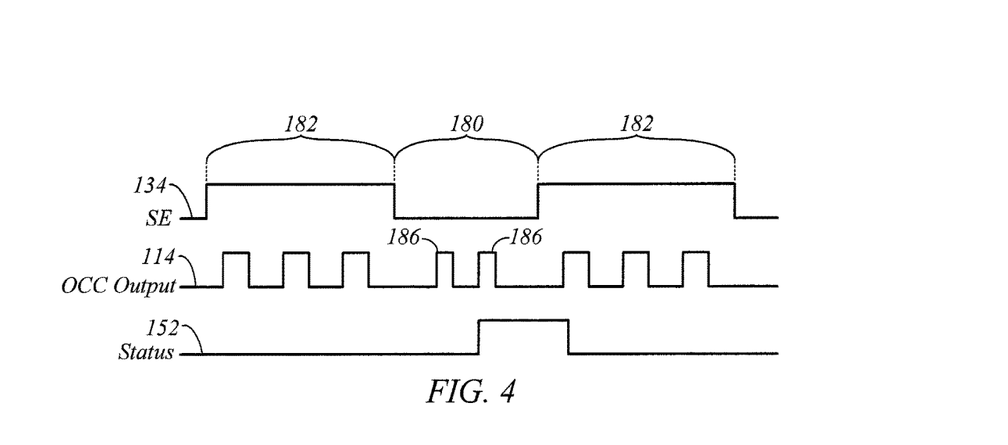
FIGS. 4-7 are signal patterns of a scan enable signal, an OCC output, and a status output, in accordance with embodiments of the present disclosure.

In FIG. 4, in response to the first transition from the shift phase 182 to the at-speed capture phase 180 in response to the scan enable signal 134 transitioning from high to low, the OCC output 114 includes a valid number of pulses 186 (e.g., two) during the at-speed capture phase 180. This expected behavior of the OCC controller 116 indicates that it is operating properly. In one exemplary embodiment, the OCC observation circuit 150 toggles the status output 152 from low to high during the at-speed capture phase in response to the second pulse 186 of the OCC output 114. After the triggering of the second shift phase 182 in response to toggling the scan enable signal 134 from low to high, the OCC observation circuit 150 transitions the status output 152 from high to low. This pattern of the transition of the status output 152 from low to high while the scan enable signal 134 is low, and the transition of the status output 152 from high to low while the scan enable signal 134 is high, indicates to the external tester 102 that the OCC output 114 did not contain an error, and that the OCC controller 116 was operating properly, during the at-speed capture phase.

The OCC output 114 during the at-speed capture phase 180 is generally in error when it does not include the valid or expected number of at-speed capture pulses 186, such as two pulses 186 shown in FIG. 4. Thus, the OCC output 114 includes an error when the OCC output 114 includes less than the valid or expected number of at-speed capture pulses 186 (FIGS. 5 and 6), or more than the valid or expected number of at-speed capture pulses 186 (FIG. 7).

Figure 5:
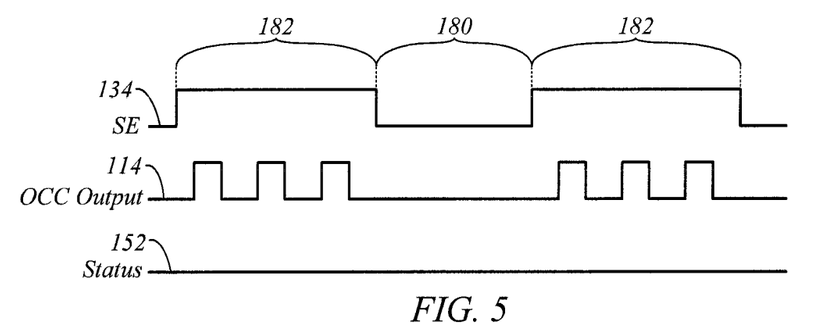

The OCC output 114 in FIG. 5 includes an error because it does not include a single at-speed capture pulse 186 during the at-speed capture phase 180, rather than the expected number of at-speed capture pulses 186 (e.g., two pulses). For this error in the OCC output 114, the observation circuit 150 maintains the status output 152 in the low state during the at-speed capture phase 180 when the scan enable signal 134 is low, and during the subsequent shift phase 182 when the scan enable signal 134 is high. The detection of this pattern by the external tester 102 indicates that the OCC output 114 contained the error, and that the OCC controller 116 was not operating properly, during the at-speed capture phase 180.

Figure 6:
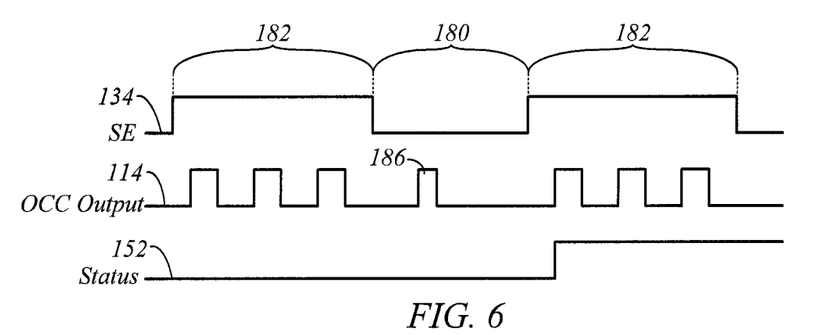

The OCC output 114 in FIG. 6 includes an error because it includes only a single at-speed capture pulse 186 during the at-speed capture phase 180, rather than the expected number of at-speed capture pulses 186 (e.g., two pulses). For this error in the OCC output 114, the observation circuit 150 maintains the status output 152 in the low state during the at-speed capture phase 180 when the scan enable signal is low, then transitions the status output 152 to high during the shift phase 182 when the scan enable signal 134 is high. The detection of this pattern by the external tester 102 indicates that the OCC output 114 contained the error, and that the OCC controller 116 was not operating properly, during the at-speed capture phase 180.

Figure 7:
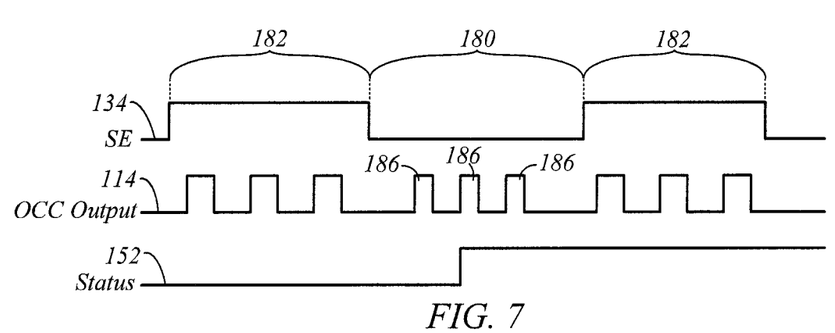

The OCC output 114 in FIG. 7 includes an error because it includes more at-speed capture pulses 186 (e.g., three pulses) than the valid or expected number of at-speed capture pulses 186 (e.g. two pulses). For this error in the OCC output 114, the observation circuit 150 transitions the status output 152 from the low state to the high state upon the detection of the second at-speed capture pulse 186 in the OCC output 114 when the scan enable signal is low, and maintains the status output 152 in the high state during the shift phase when the scan enable signal 134 is high. The detection of this pattern by the external tester 102 indicates that the OCC output 114 contained the error, and that the OCC controller 116 was not operating properly, during the at-speed capture phase 180.

Figure 8:
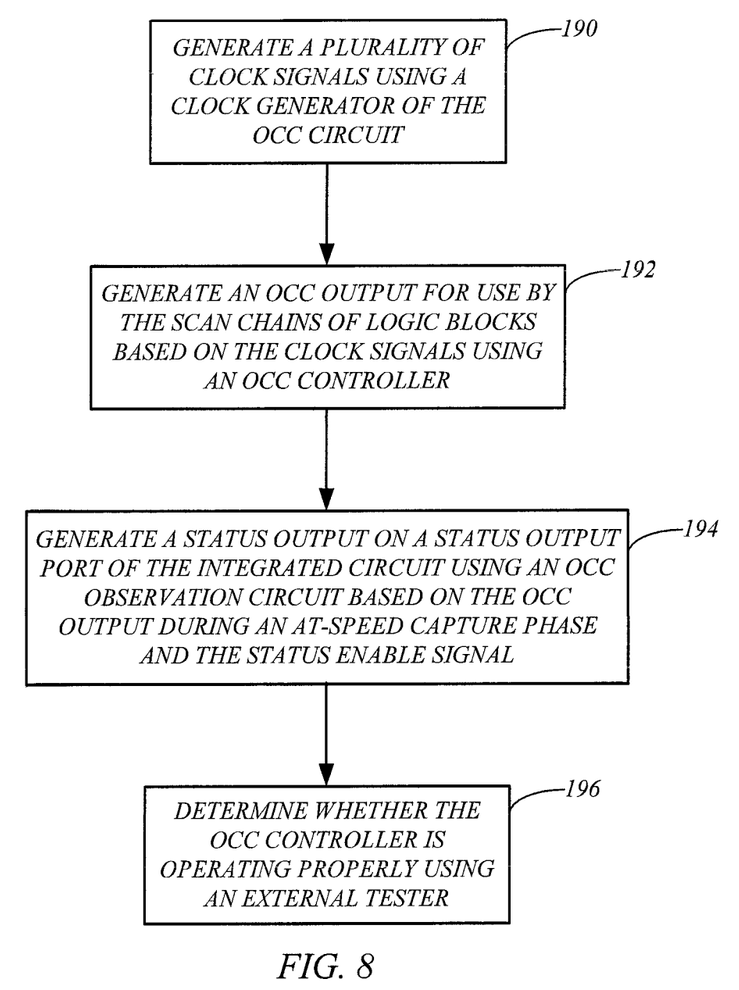
FIG. 8 is a flowchart illustrating a method of monitoring operation of an OCC circuit of an IC, in accordance with embodiments of the present disclosure.

FIG. 8 is a flowchart illustrating a method of monitoring operation of an OCC circuit 113 of an IC 100, in accordance with embodiments of the present disclosure. At 190 of the method, a plurality of clock signals 128 are generated using a clock generator 115 of the OCC circuit 113 and, at 192, an OCC output 114 for use by the scan chains 104 of logic blocks 140 (FIG. 2) based on the clock signals 128 using an OCC controller 116, such as discussed above with regard to FIGS. 1 and 2.

At 194 of the method, a status output 152 on a status output port 108S of the integrated circuit 100 is generated using an OCC observation circuit 150 based on the OCC output 114 during an at-speed capture phase and the scan enable signal 134. In some embodiments of step 194, a valid pattern of the status output is generated using the OCC observation circuit 150 with respect to the scan enable signal 134 when the OCC output 114 includes a valid number of at-speed capture pulses 186, such as shown in FIG. 4. Embodiments of step 194 also include generating a first invalid pattern of the status output 152 with respect to the scan enable signal 134 when the OCC output 114 includes a first error, and generating a second invalid pattern of the status output 152 with respect to the scan enable signal 134 when the OCC output 114 includes a second error that is different from the first error. In some embodiments of the method, a third invalid pattern of the status output 152 with respect to the scan enable signal 134 is generated when the OCC output 114 includes a third error that is different from the first and second errors. The first, second, and third errors of the OCC output 114 may each correspond to one of the OCC output 114 not including an at-speed capture pulse 186 (FIG. 5), the OCC output 114 including less than the valid or expected number of at-speed capture pulses 186 (FIG. 6), and the OCC output 114 having more than the valid or expected number of at-speed capture pulses 186 (FIG. 7).

At 196 of the method, the external tester 102 determines whether the OCC controller 116 is operating properly based on patterns generated in step 194. For example, the external tester 102 determines that the OCC controller 116 is operating properly when the valid pattern (e.g., FIG. 4) is generated in step 194, and the external tester 102 determines that the OCC controller 116 is not operating properly when one of the invalid patterns (e.g., FIGS. 5-7) is generated in step 194.

Although various examples of an observation circuit for detecting errors in an OCC output are provided in the present disclosure, embodiments are not limited to the particular examples. It is to be understood that even though numerous characteristics and advantages of various embodiments of the disclosure have been set forth in the foregoing description, together with details of the structure and function of various embodiments of the disclosure, this disclosure is illustrative only, and changes may be made in detail, especially in matters of structure and arrangement of parts within the principles of the present disclosure to the full extent indicated by the broad general meaning of the terms in which the appended claims are expressed.

What is claimed is:

1. An on-chip clock (OCC) circuit of an integrated circuit having logic blocks coupled in scan chains, the OCC circuit comprising:
  a clock generator configured to generate a plurality of clock signals;
  an OCC controller configured to receive the plurality of clock signals and generate an OCC output for use by the scan chains of logic blocks; and
  an OCC observation circuit configured to generate a status output on a status output port based on the OCC output during an at-speed capture phase and a scan enable signal;
  wherein patterns of the status output with respect to the scan enable signal include a valid pattern indicating that the OCC output includes a valid number of at-speed capture pulses, a first invalid pattern indicating a first error in the OCC output, and a second invalid pattern indicating a second error in the OCC output that is different from the first error.

2. The OCC circuit according to claim 1, wherein the first and second errors each indicate an error in the OCC output selected from the group consisting of the OCC output does not include an at-speed capture pulse, the OCC output consists of a single at-speed capture pulse, and the OCC output includes more than two at-speed capture pulses.

3. The OCC circuit according to claim 2, wherein the patterns of the status output with respect to the scan enable signal include a third pattern indicating a third error in the OCC output that is different than the first and second errors.

4. The OCC circuit according to claim 1, wherein the valid pattern is generated when the OCC output consists of two at-speed capture pulses.

5. The OCC circuit according to claim 4, wherein the first invalid pattern is generated when the OCC output does not include an at-speed capture pulse.

6. The OCC circuit according to claim 5, wherein the second invalid pattern is generated when the OCC output consists of a single at-speed capture pulse.

7. The OCC circuit according to claim 6, wherein a third invalid pattern is generated when the OCC output includes more than two at-speed capture pulses.

8. The OCC circuit according to claim 1, wherein the OCC observation circuit comprises a pair of flip-flops and a plurality of logic gates.

9. The OCC circuit according to claim 8, wherein each of the flip-flops of the OCC observation circuit receives the OCC output.

10. The OCC circuit according to claim 9, wherein the logic gates of the OCC observation circuit process the scan enable signal.

11. The OCC circuit according to claim 9, wherein logic of the OCC observation circuit includes an initialization register for initializing the flip-flops of the OCC observation circuit.

12. The OCC circuit according to claim 1, wherein the status output port holds its value when the OCC output includes the first or second error.

13. A method of monitoring operation of an on-chip clock (OCC) circuit of an integrated circuit having logic blocks coupled in scan chains, the method comprising:
generating a plurality of clock signals using a clock generator of the OCC circuit;
generating an OCC output for use by the scan chains of logic blocks based on the clock signals using an OCC controller of the OCC circuit;
generating a status output on a status output port of the integrated circuit using an OCC observation circuit based on the OCC output during an at-speed capture phase and the scan enable signal including:
generating a valid pattern of the status output with respect to the scan enable signal when the OCC output includes a valid number of at-speed capture pulses;
generating a first invalid pattern of the status output with respect to the scan enable signal when the OCC output includes a first error; and
generating a second invalid pattern of the status output with respect to the scan enable signal when the OCC output includes a second error that is different from the first error; and
determining whether the OCC controller is operating properly based on generating the status output using an external tester.

14. The OCC circuit according to claim 1, wherein the first and second errors each indicate an error in the OCC output selected from the group consisting of the OCC output does not include an at-speed capture pulse, the OCC output consists of a single at-speed capture pulse, and the OCC output includes more than two at-speed capture pulses.

15. The method according to claim 13, wherein generating the valid pattern comprises generating the valid pattern when the OCC output consists of two at-speed capture pulses.

16. The method according to claim 15, wherein generating the first invalid pattern comprises generating the first invalid pattern when the OCC output does not include an at-speed capture pulse.

17. The method according to claim 16, wherein generating the second invalid pattern comprises generating the second invalid pattern when the OCC output consists of a single at-speed capture pulse.

18. The method according to claim 17, further comprising generating a third invalid pattern of the status output with the respect to the scan enable signal when the OCC output comprises more than two at-speed capture pulses.

19. An integrated circuit comprising:
a plurality of input/output ports;
logic blocks connected in scan chains; and
an on-chip clock (OCC) circuit comprising:
a clock generator configured to generate a plurality of clock signals;
an OCC controller configured to receive the plurality of clock signals and generate an OCC output for use by the scan chains of logic blocks; and
an OCC observation circuit configured to generate a status output on a status output port based on the OCC output during an at-speed capture phase and a scan enable signal;
wherein patterns of the status output with respect to the scan enable signal include a valid pattern indicating that the OCC output includes valid number of at-speed capture pulses, a first invalid pattern indicating a first error in the OCC output, and a second invalid pattern indicating a second error in the OCC output that is different from the first error.

20. The integrated circuit according to claim 19, wherein the first and second errors each indicate an error in the OCC output selected from the group consisting of the OCC output does not include an at-speed capture pulse, the OCC output consists of a single at-speed capture pulse, and the OCC output includes more than two at-speed capture pulses.

* * * * *